March 31, 1970 MASAYUKI YAMAMOTO 3,503,813

METHOD OF MAKING A SEMICONDUCTOR DEVICE

Filed Dec. 13, 1966 2 Sheets-Sheet 1

INVENTOR
MASAYUKI YAMAMOTO

BY Paul M. Craig, Jr.
ATTORNEY

INVENTOR
MASAYUKI YAMAMOTO

BY Paul M. Craig, Jr.
ATTORNEY

United States Patent Office
3,503,813
Patented Mar. 31, 1970

3,503,813

METHOD OF MAKING A SEMICONDUCTOR DEVICE

Masayuki Yamamoto, Kodaira-shi, Japan, assignor to Hitachi, Ltd., Tokyo, Japan, a corporation of Japan Filed Dec. 13, 1966, Ser. No. 601,407
Claims priority, application Japan, Dec. 15, 1965, 40/76,695
Int. Cl. H01l 7/44
U.S. Cl. 148—187 17 Claims

ABSTRACT OF THE DISCLOSURE

A method of making semiconductor devices wherein a major surface portion of a semiconductor body, such as silicon, having a diffused region is chemically etched to remove a thin portion of said major surface by exposing the body to an etchant including, for example, nitric acid and hydrofluoric acid thereby removing thermal distortions, unnecessary impurity atoms or metal ions in the major surface portion of said body, and whereafter an insulating film is deposited on the etched surface of the body at a temperature sufficiently low to preclude rediffusion of impurities in the semiconductor body.

This invention relates to a method of making a semiconductor device comprising a P-N junction formed by selective diffusion of impurity and more particularly to a method of surface treatment which is quite effective when applied to the manufacture of a semiconductor device wherein the semiconductor surfaces, including a part where the end part of said P-N junction is exposed, are passivated with insulating films.

There is widely used for forming a P-N junction a method which utilizes the phenomenon of so-called thermal diffusion. According to this method, an impurity which determines the conductivity type such as an element belonging to Group III or V of the Periodic Table is diffused into a semiconductor substrate at a temperature above a certain setting value. With the development of this method, a transistor, a diode or the like comprising a diffused P-N junction has become superior to one comprising a P-N junction formed by alloy method in its electrical characteristics. For example, the former enjoys a higher current amplification (particularly at a high frequency), a lower noise, a higher backward breakdown voltage etc.

Recently, effort has been concentrated on the improvement in a semiconductor device comprising a diffused P-N junction and as a result, various semiconductor elements having a structure of a planar type, a mesa type or the like have come to be widely used for practical applications.

In a planar type semiconductor device made of silicon, oxide films formed by oxidizing the surfaces of a silicon substrate are used for masking and a P-N junction is formed by selectively diffusing an impurity material for determining the conductivity type into a silicon substrate through a hole provided through said oxide films. Said oxide films are made to remain after the manufacture of the element in order to provide protection of the end part of the P-N junction. Thus, the variation with time of the electrical characteristics of the element can be avoided and the element can be passivated against the outer atmosphere.

Another method of passivating semiconductor surface is also employed, in which, instead of using said oxide films formed of a silicon substrate, silicon oxide or silicon nitride is deposited from vapor phase on the semiconductor surfaces by a method of thermal decomposition of halides or by a method of cathode sputtering.

According to yet another method, the surface parts of said silicon oxide films are vitrified with lead oxide, phosphorus pentoxide or the like.

However, a semiconductor element comprising a diffused P-N junction fabricated by the known methods described above does not exhibit satisfactory reverse leakage current, noise characteristics, stability of surface conditions etc. and further improvements in these respects have been desired.

For example, said silicon oxide has a tendency to make the conductivity type of the semiconductor surfaces in contact therewith into an N-type conductivity and this tendency is responsible for the decrease of the breakdown voltage and the increase of the surface leakage current in a planar-type transistor. In other words, the cause for poor electrical characteristics of a semiconductor device passivated with insulating films has been ascribed to the properties of the insulating films. Therefore, much effort has been made to improve the insulating films. For example, use of silicon nitride instead of silicon oxide was proposed. Also, there was proposed a method in which the surfaces of the silicon oxide are vitrified with phosphorus pentoxide.

Though effort has been directed to the improvement in the insulating films for protection, the investigation by the present inventor showed that the properties of the surface layers consisting of thermal or chemical distortions, dirt, undesirable impurity layers and so forth are closely related to the leakage current, the current amplification and the noise characteristics of the element.

Therefore, an object of the invention is to provide a method of making a semiconductor device comprising a diffused P-N junction and characterized by improved electrical properties.

It is another object of the invention to provide a method of making a semiconductor device having a small surface leakage current or a good noise figure and whose semiconductor surfaces are protected with insulating films.

It is a further object of the invention to provide a method of manufacturing a transistor having a high current amplification.

According to the present invention, there is provided a novel method of surface treatment of a semiconductor element whereby the surfaces of a semiconductor substrate are subjected to selective diffusion treatment and then the unnecessary layers like undesired impurity layers formed thermally and chemically during the diffusion treatment, dirt, layers of thermal distorticns etc. are etched and removed.

For a better understanding of the invention, reference is made to the following detailed description taken in conjunction with the accompanying drawings, wherein.

Figure 1:
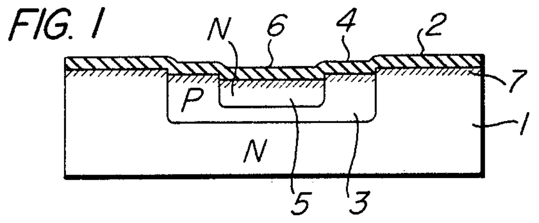
FIGS. 1 to 3 are sectional diagrams showing respective manufacturing processes according to the invention.

FIG. 1 shows a silicon N-P-N transistor fabricated by vapor phase diffusion. In order to obtain such a transistor, a surface of an N-type silicon substrate 1 cut from an N-type silicon bar provided by crystal pulling is cleaned by etching and then a first $SiO_2$ film 2 is formed over the exposed portions of the surface by a thermal oxidation method. Then, a hole penetrating through said $SiO_2$ film 2 and reaching said surface is provided at a desired position by a known photo-engraving technique, said hole determining the position of the base region. Through said hole, an element belonging to Group III like boron is diffused in an oxidizing atmosphere by a known vapor phase diffusion method to form a P-type base region 3. In this case, not only a P-N junction is formed between the P-type base region 3 and the substrate 1, but also a second $SiO_2$ film 4 is produced on the surface of the P-type base region 3. Then, another hole penetrating through said second film 4 and reaching said P-type base region 3 is provided and an element of group V like phosphorous is thermally diffused selectively through said hole to form an N-type emitter region 5 in a range within the diffusion length of minority carriers from said P-N junction. At this stage, not only a P-N junction is formed between said N-type region 5 and said P-type region 3, but also a third $SiO_2$ film 6 is formed on the surface of said N-type region 5.

According to one form of the prior art, the substrate 1 of the assembly fabricated as described above and shown in FIG. 1 is then used as a collector region and is soldered to a stem header or the like. Further, a hole penetrating through the third $SiO_2$ film 6 on the N-type emitter region 5 and reaching said region 5 and a hole penetrating through the second $SiO_2$ film 4 on the P-type base region 3 and reaching said region 3 are provided. Through said holes, an emitter and a base electrode of a metal like aluminum are formed on the emitter region 5 and on the base region 3, respectively, said electrodes being in ohmic contact with the respective regions. In this case, said $SiO_2$ films other than at the electrode holes work as films for surface protection and stabilization and contribute to the electrical and mechanical stability of the element.

According to another embodiment of the prior art, all of said first and second $SiO_2$ films (2, 4 and 6) of the assembly as shown in FIG. 1 are removed and replaced by an oxide insulating film such as a $SiO_2$ film, formed afresh according to thermal oxidation method or organic silane decomposition method. Said treatment is aimed to prevent those bad influences on the electrical working characteristics of the element, the life of the element and so on which are caused by the contamination during the diffusion or etching process of the initially formed $SiO_2$ films 2, 4 and 6. Said newly formed $SiO_2$ film or the like can be used without further treatment as film for surface protection and stabilization, but sometimes a portion of the surface layer or the entire of said new $SiO_2$ film is vitrified with lead oxide or phosphorous pentoxide in order to obtain better electrical characteristics and better stability. Said undesired surface layers are designated by numeral 7.

According to the present invention, on the other hand, the $SiO_2$ films (2, 4 and 6) covering the semiconductor surfaces are completely removed after completion of the selective diffusion treatment, during which said films are employed as masks. Then the semiconductor surface is subjected to etching treatment to remove said undesired surface layer 7.

Figure 2:
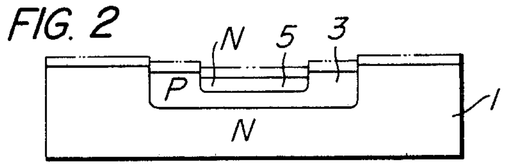

The elimination of the $SiO_2$ films is done by use of an etchant including HF and $NH_4F$ as principal components. The state after the removal of the oxide films is shown by dotted lines in FIG. 2. Then, said semiconductor substrate is immersed into an etchant including $HNO_3$ and HF as principal components and the surface layers 7 are removed as shown in FIG. 2. The extent of etching is an important factor which determines the electrical properties of the element and will be described in detail hereinbelow.

Figure 3:
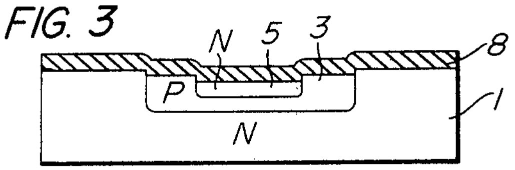

Then, as shown in FIG. 3, another insulating film 8 is adhered to the semiconductor surfaces subjected to etching treatment. In the present invention, this insulating film must be deposited from outside and films formed of the substrate cannot be used. As said insulating film, a silicon oxide film deposited from vapor phase, for example, can be used. For example, if tetraethoxysilane of partial pressure of 0.1–1 mm. Hg is introduced with a carrier gas consisting of nitrogen gas into a furnace having a temperature of 750° C. wherein said semiconductor substrate is inserted and thermal decomposition of said tetraethoxysilane is continued for about twenty minutes, then a silicon oxide film having a thickness of 4000–6000 A. is deposited on the semiconductor surfaces.

It is desirable to choose as said pyrolytic temperature such a temperature that does not cause the re-diffusion of that impurity for determining the conductivity type which is formerly introduced into the semiconductor substrate. In the case of a silicon semiconductor, a relatively low temperature of 600–800° C. is chosen.

Then, the surface parts or all the parts of the silicon oxide may be vitrified with lead oxide or phosphorous pentoxide thereby to add to the effect of passivation. It is also possible to use silicon nitride or aluminum trioxide deposited from vapor phase according to known methods instead of silicon oxide.

The thickness of the film is determined by considering the difference in the passivation effect or in the coefficient of thermal expansion of the material and a thickness of a few thousand angstroms to a few microns is generally appropriate.

Figure 4:
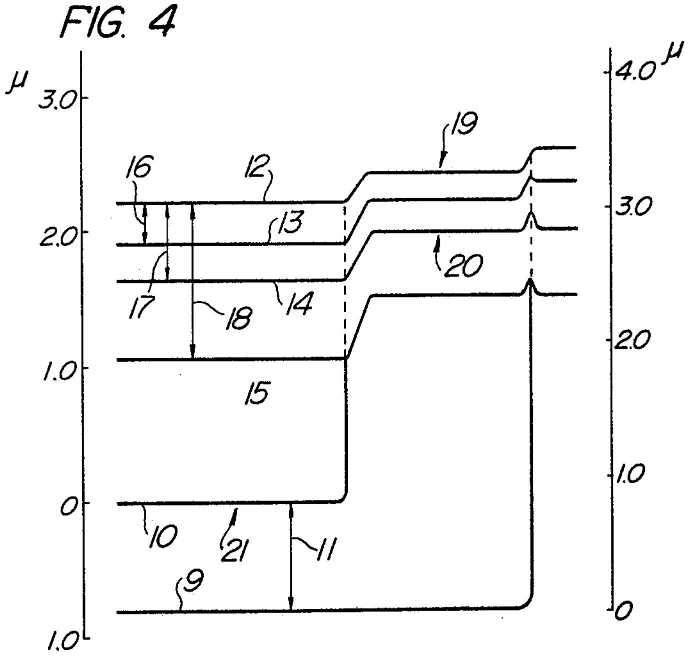
FIG. 4 is a fragmentary sectional diagram showing the state of a semiconductor surface subjected to etching treatment according to the invention.

In FIG. 4, reference numeral 9 designates a collector-base junction and reference numeral 10 designates an emitter-base junction. A base width 11 is made to be smaller than the diffusion length of the minority carriers in the base region 3, as described hereinabove. Reference numeral 12 indicates the position of the semiconductor surface before subjected to the etching treatment.

Reference numerals 13, 14 and 15 show the positions of the semiconductor surface etched with a mixed etchant consisting of 50 parts of 38% nitric acid and 3 parts of 4% hydrofluoric acid for 3, 6 and 9 seconds, respectively. In FIG. 4, the left ordinate shows a distance from the emitter-base junction 10, while the right ordinate shows a distance from the collector-base junction 9 (in units of microns in both cases). As is seen from this diagram, the etching depths 16, 17 and 18 are measured from the emitter surface 12 down into emitter region after etching for a period of 3 sec., 6 sec. and 9 sec., the etching depths 16, 17 and 18 were $0.3\mu$, $0.6\mu$ and $1.1\mu$, respectively.

Thus, with the same etching time, the emitter region is more deeply etched than the base region because the concentration of surface impurity is higher in the emitter region. For example, the concentration of impurity in the base region is about $9.9\times10^{18}$ atoms/cm.$^3$ at 19 (before etching), about $7.6\times10^{17}$ atoms/cm.$^3$ at 20 (the surface the base region after etching of 6 sec.) and about $7\times10^{15}$ atoms/cm.$^3$ at 21 (in the vicinity of the base-emitter junction).

Figure 5:
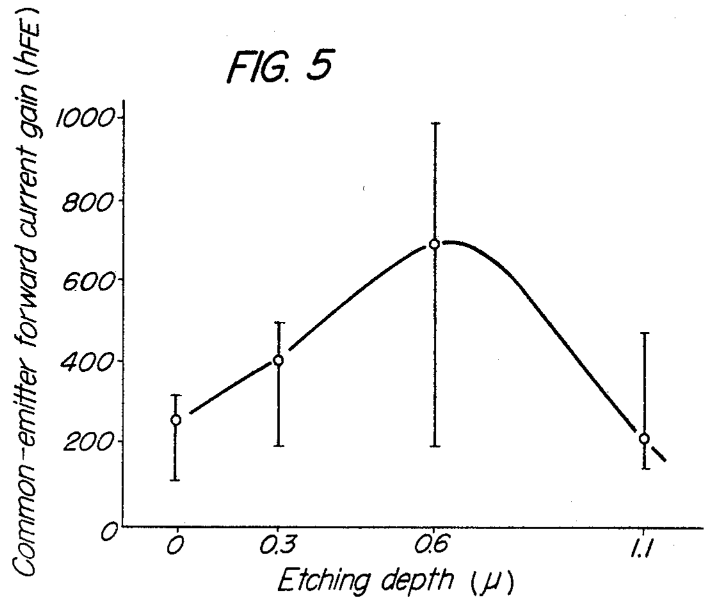
FIG. 5 shows a relation between the depth of etching and the current gain for the common-emitter connection.
Figure 6:
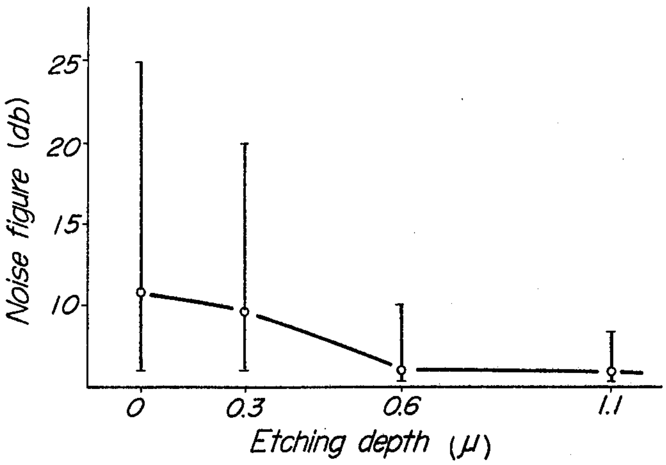
FIG. 6 is a diagram showing a relation between the depth of etching and the noise figure.

FIGS. 5 and 6 show, respectively, a relation between the etching depth in the emitter region and the common-emitter forward current gain $h_{FE}$ and a relation between the etching depth in the emitter region and the noise figure (db) of a silicon N-P-N transistor passivated with an insulating film as shown in FIG. 3 after the etching treatment according to the invention. In these figures, the central values as well as the ranges of the fluctuation between samples are shown.

The insulating film of the transistor used in this measurement is a silicon oxide film whose surface is vitrified with lead oxide. The method of vitrification is as follows.

Lead is evaporated onto the silicon oxide layer of 4000–6000 A. in thickness which is deposited by thermal decomposition of tetraethoxysilane. An evaporation source comprising 100 mg. of lead is spaced 13 cm. from a semiconductor wafer comprising said silicon oxide layer. Evaporation onto said wafer is continued in a vacuum on the order of $10^{-2}$ mm. Hg until all 100 mg. of said lead disappears. In this case, the temperature of said wafer is held at an ordinary termperature.

Then, said wafer is placed within an oxygen atmosphere at 350° C. for thirty minutes to convert said evaporated metal completely into lead oxide. The temperature of the furnace is then raised to 600° C. and held constant for thirty minutes to vitrify the surface of the silicon oxide layer through a reaction between said silicon oxide and said lead oxide.

FIG. 5 shows a relation between the etching depth measured from the position of the surface of the emitter region before etching and the common-emitter forward current gain $h_{FE}$ measured with collector current $I_c=1$ ma. and emitter-base voltage $V_{CE}=1$ v. The result with the etching depth 0 is a result when the invention it not applied and there follows the results obtained with etching depths of 0.3$\mu$, 0.6$\mu$ and 1.1$\mu$. In the case of this embodiment, a maximum $h_{FE}$ is obtained with the etching depth of about 0.6$\mu$, as seen from the figure. The etching depth of 0.6$\mu$ was obtained with an etching time of about 6 sec. However, since the etching depth and the etching time naturally depend on the diffusion state of the element to be treated and on the concentration and the kind of the etchant, a suitable condition should be chosen depending on circumstances. The fact that an etching depth of about 1.1$\mu$ produces a contrary result is ascribed to an excess etching of the emitter which lowers the injection efficiency of minority carriers.

The etching depth is closely connected with the diffusion depth of the emitter impurity and in said embodiment, the depth of the bottom of the emitter region before etching was 2.2$\mu$ while the depth of the emitter region after etching of 6 sec. was 1.6$\mu$.

Namely, an optimum result is generally obtained when etching is done so that the depth of the emitter region approximates 0.7*d*, where *d* is the depth of the emitter region before etching.

FIG. 6 shows a variation of a noise figure (db) with the etching depth. It is seen that the etching depth of more than about 0.6$\mu$ is preferable also in this case. In this case, NF (noise figure) was measured with 120 c./s., emitter current $I_E=50$ $\mu$a., collector emitter voltage $V_{CE}=6$ v. and resistance of signal source $Rg=10$ K$\Omega$.

It is evident from these two drawings that remarkably improved electrical characteritics, i.e. a high current amplification, a low noise figure etc. can be obtained if the surface layers are removed by about 0.6$\mu$. When considered from a different viewpoint, the results show that layers of thermal distortions, layers of unnecessary impurity atoms, layers of metal ions etc. formed during the diffusion treatment are laminated particularly in the surface layers having a depth of this order and that these layers can be eliminated by etching.

Therefore, if the surfaces of the element are covered with a clean $SiO_2$ film after the elimination of the surface layers including said unnecessary layers, the variation with time of the element can be minimized and a reliable and stable element can be obtained since the effect of said surface layers disappears. Further, a better result was obtained by vitrifying said $SiO_2$ film according to a conventional method.

Generally, the present invention is effective when applied to a semiconductor device comprising a P-N junction formed by a diffusion method, in particular to one comprising a P-N junction to be biased in a forward direction. The extent of etching in the range of 0.4–1.1$\mu$ is suitable in the case of said transistor in view of both the current amplification and the noise figure. In other words, it is generally suitable to control the etching depth so that the depth of the diffusion region may be reduced to about 0.8–0.5 of thickness prior to etching.

Though the invention has been described with reference to a specific embodiment, i.e. a planar type silicon N-P-N transistor, it will be apparent to those skilled in the art that the invention can be equally applied to a mesa type diffusion transistor, a diode or the like.

As is fully described above, the present invention can be applied with simple processes and according to the invention, the leakage current can be reduced and thereby the current gain and the noise figure can be improved. Further, films for protection and stabilization of the element can be provided while keeping the substrate surfaces clean. Therefore, the present invention is quite useful for industrial applications.

What is claimed is:

1. A method of making a semiconductor device including the steps of preparing a substrate of a semiconductor having a first conductivity type, said substrate having a substantially flat surface, forming in said flat surface a semiconductor region by selectively diffusing an impurity of a second conductivity type from said flat surface into said substrate, said semiconductor region having said second conductivity type and being separated from the substrate region having the first conductivity type by a dish-shaped P-N junction whose end portion is exposed on said surface, and etching said substrate from said surface so that the depth of the bottom of said dish-shaped P-N junction measured from the surface may become 0.5*d*–0.8*d*, where *d* denotes the depth of the bottom of said dish-shaped P-N junction before etching measured from said flat surface.

2. A method of making a semiconductor device according to claim 1, which further includes the step of vapor phase depositing from about a few thousand angstroms to a few microns of an insulating material on said etched surface.

3. A method of making a semiconductor device including the steps of: preparing a substrate of a semiconductor having a first conductivity type, said substrate having a substantially flat surface, forming in said flat surface an insulating film having a hole reaching said surafce, forming a semiconductor region having a second conductivity type by selectively diffusing an impurity of said second conductivity type through said hole into said substrate, said semiconductor region being separated from the substrate region having the first conductivity type by a dish-shaped P-N junction, eliminating said insulating film completely from said flat surface, and etching said substrate from said surface so that the depth of the bottom of said dish-shaped P-N junction measured from the surface may become 0.5*d*–0.8*d*, where *d* denotes the depth of the bottom of said dish-shaped P-N junction measured from said flat surface.

4. A method of making a semiconductor device according to claim 3, which further includes the step of vapor phase depositing from about a few thousand angstroms to a few microns of an insulating material on said etched surface.

5. A method of making a transistor comprising a collector region having a first conductivity type, a base region having a second conductivity type and an emitter region having the first conductivity type, wherein at least all the end portions of a P-N junction formed between said base region and said emitter region reach a substantially flat surface of the semiconductor substrate, said method including the following steps:

(1) forming on said surface of said semiconductor substrate an insulating film having a hole reaching said base region, (2) forming an emitter region having a higher concentration of impurity than said base region by selectively diffusing through said hole of the insulating film an impurity for determining said first conductivity type, (3) exposing at least said flat surface by eliminating said insulating film, (4) exposing said semiconductor substrate to an etchant until the depth of the bottom of said emitter junction measured from the surface becomes 0.5 to 0.8 times the depth before etching, and (5) covering the surface of the semiconductor substrate with an insulating film, said surface including the surfaces where the end portions of the P-N junctions formed between said collector region and said base region and between said emitter region and said base region are exposed.

6. A method of making a semiconductor device according to claim 5, including the steps of depositing a silicon oxide layer on said etched surface of the substrate by thermal decomposition of an organo-oxy-silane, and vitrifying the upper part of said oxide layer with another oxide.

7. A method of making a transistor, including the steps of:

(1) preparing a substrate of a semiconductor having a first conductivity type, said substrate having a substratally flat surface, (2) forming on said flat surface an insulating film comprising a first hole reaching said surface, (3) forming a base region having a second conductivity type by selectively diffusing an impurity of said second conductivity type through said hole into said substrate, said base region being separated from the substrate region having said first conductivity type and consisting a collector by a dish-shaped P-N junction whose end part reaches said flat surface, (4) forming an insulating film covering said first hole and comprising a second hole reaching said base region, (5) forming in said base region an emitter region having the first conductivity type by selectively diffusing through said second hole an impurity of the first conductivity type, said emitter region being separated from said base region by a dish-shaped P-N junction whose end part reaches said flat surface, (6) exposing said flat surface by completely eliminating said insulating film, and (7) eliminating the surface part of said substrate by exposing to an etchant said surface from which the insulating film is completely eliminated until the depth of the bottom of the dish-shaped P-N junction measured from the surface becomes 0.5 to 0.8 of the depth before etching, said P-N junction being formed between said base region and said emitter region.

8. A method of making a transistor according to claim 7, including the step of depositing an insulating film on said etched substrate surface in such a way as to cover at least the parts where said two P-N junctions reach said flat surface.

9. A method of making a transistor according to claim 7, including the steps of depositing a silicon oxide layer on said etched substrate surface by thermal decomposition of an organo-oxy-silane and vitrifying the upper portion of the silicon oxide layer with another oxide.

10. A method for producing a semiconductor device, comprising the steps of:

forming in a semiconductor body a semiconductor region defining with the adjacent region a P-N junction terminating at a major surface of said body;

exposing the major surface of said semiconductor body to an etchant to eliminate the surface portion of said body to an extent of at least a few thousand angstroms but less than the original thickness of said semiconductor region measured from said major surface; and thereafter depositing an insulating film on the etched surface of the semiconductor body to cover the edge portion of said P-N junction at a temperature sufficiently low to substantially preclude the conductivity type determining impurities previously introduced in the semiconductor body from rediffusing.

11. A method for producing a semiconductor device, comprising the steps of:

introducing a first conductivity type determining impurity into a silicon semiconductor body through a hole in a mask layer formed on a major surface of said body, thereby forming in said body a diffused region defining with the adjacent region of a second conductivity type opposite to said first conductivity type a P-N junction terminating at said major surface;

removing said mask layer from said major surface of said body;

exposing said major surface of said silicon semiconductor body to an etchant including nitric acid and fluoric acid to remove the surface portion of said body to an extent of at least 0.4 micron but less than the original depth of said diffused region from said major surface before etching; and thereafter depositing on the major surface exposed to said etchant a film of insulating material including at least a substance selected from the group consisting of silicon oxide, silicon nitride, aluminum oxide, phosphorus oxide and lead oxide at a sufficiently low temperature to preclude the impurity determining the first conductivity type from diffusing.

12. A method for producing a semiconductor device, comprising the steps of:

introducing phosphorous atoms into a silicon crystalline body through a hole in a mask layer formed on a major surface of said body, thereby forming in said body an N-type diffused region defining with the adjacent P-type region a P-N junction terminating at the major surface;

removing said mask layer from said major surface of the body;

attacking said major surface of said silicon body with an etchant including nitric acid and fluoric acid to remove the surface portion of said body to an extent of at least 0.4 micron but less than the original depth of said diffused region measured from said major surface before etching; and thereafter depositing a film of silicon oxide having a thickness of from a few thousand angstroms to a few microns on the etched major surface at a temperature below about 800° C.

13. A method for producing a semiconductor device, comprising the steps of:

introducing a first conductivity type determining impurity into a semiconductor body having a second conductivity type through a hole in a mask layer formed on a major surface of said body, thereby forming in said body a junction between two conductivity types, said junction terminating at said major surface and extending a length $d$ measured from said major surface to the bottom of said junction;

removing said mask layer from said major surface;

etching said major surface until the length measured from the bottom of said junction to the newly exposed etched major surface is from about $0.8d$ to $0.5d$; and thereafter depositing a film of insulating material having a thickness of from a few angstroms to a few microns on said etched major surface at a temperature below about 800° C.

14. A method of making a semiconductor device according to claim 13, wherein said first conductivity type and said second conductivity types are N-type and P-type, respectively.

15. A method of making a semiconductor device according to claim 14, wherein said etchant includes nitric acid and hydrofluoric and wherein a sufficient thickness of said major surface is removed in less than ten seconds.

16. A method of making a semiconductor device according to claim 15, wherein said insulating film comprises at least one substance selected from the group consisting of silicon oxide, silicon nitride, aluminum oxide, phosphorous oxide and lead oxide.

17. A method of making a semiconductor device according to claim 15, wherein said insulating film comprises silicon exide and said silicon oxide is deposited by a thermal decomposition of an organo-oxy-silane.

References Cited

UNITED STATES PATENTS

| | | | |
|---|---|---|---|
| 2,899,344 | 8/1959 | Atalla et al. | 148—187 |
| 3,007,830 | 11/1961 | Bardsley | 156—17 |
| 3,085,033 | 4/1963 | Handelman | 148—1.5 |
| 3,226,611 | 12/1965 | Haenichen | 156—17 |
| 3,231,422 | 1/1966 | Emeis | 156—17 |
| 3,290,180 | 12/1966 | Baird et al. | 148—187 |
| 3,357,902 | 12/1967 | Benjamini et al. | 156—17 |
| 3,390,011 | 6/1968 | Brown et al. | 156—17 |

L. DEWAYNE RUTLEDGE, Primary Examiner

R. A. LESTER, Assistant Examiner

U.S. Cl. X.R.

148—188; 156—17